(12) United States Patent
Fellous et al.

(10) Patent No.: US 8,053,801 B2
(45) Date of Patent: Nov. 8, 2011

(54) MONOLITHIC PHOTODETECTOR

(75) Inventors: Cyril Fellous, Echirolles (FR); Nicolas Hotellier, Grenoble (FR); Christophe Aumont, Jarrie (FR); Francois Roy, Seyssins (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 12/704,797

(22) Filed: Feb. 12, 2010

(65) Prior Publication Data

US 2010/0144388 A1 Jun. 10, 2010

Related U.S. Application Data

(62) Division of application No. 11/706,928, filed on Feb. 14, 2007, now Pat. No. 7,663,160.

(51) Int. Cl.
*H01L 33/00* (2010.01)
(52) U.S. Cl. .......... 257/98; 257/184; 257/187; 257/257; 257/291; 257/436; 257/E31.083
(58) Field of Classification Search .......... 257/184, 257/187, 257, 291, 98, 436
See application file for complete search history.

(56) References Cited

U.S. PATENT DOCUMENTS

| | | | |
|---|---|---|---|
| 5,408,547 A | 4/1995 | Lebby et al. | |
| 6,088,492 A | 7/2000 | Kaneko et al. | |
| 6,251,700 B1 | 6/2001 | Lin et al. | |
| 6,259,083 B1 | 7/2001 | Kimura | |
| 6,858,828 B2 | 2/2005 | Roy et al. | |
| 7,663,160 B2 | 2/2010 | Fellous et al. | |
| 2002/0086166 A1 | 7/2002 | Hendricks et al. | |
| 2003/0071366 A1* | 4/2003 | Rubinsztajn et al. | 257/791 |
| 2005/0001146 A1 | 1/2005 | Quinlan | |
| 2005/0127463 A1* | 6/2005 | Yaung et al. | 257/443 |
| 2006/0138577 A1* | 6/2006 | Hashimoto | 257/432 |
| 2007/0015083 A1 | 1/2007 | Babich et al. | |

FOREIGN PATENT DOCUMENTS

FR 2829876 A1 3/2003

OTHER PUBLICATIONS

French Search Report Dated Oct. 5, 2006, for French Patent Application No. 06/50536 Filed Feb. 14, 2006.

* cited by examiner

*Primary Examiner* — Wai-Sing Louie
(74) *Attorney, Agent, or Firm* — Lisa A. Jorgenson; Kevin D. Jablonski; Graybeal Jackson LLP

(57) ABSTRACT

A photodetector including a photodiode formed in a semiconductor substrate and a waveguide element formed of a block of a high-index material extending above the photodiode in a thick layer of a dielectric superposed to the substrate, the thick layer being at least as a majority formed of silicon oxide and the block being formed of a polymer of the general formula $R_1R_2R_3SiOSiR_1R_2R_3$ where $R_1$, $R_2$, and $R_3$ are any carbonaceous or metal substituents and where one of $R_1$, $R_2$, or $R_3$ is a carbonaceous substituent having at least four carbon atoms and/or at least one oxygen atom.

15 Claims, 1 Drawing Sheet

MONOLITHIC PHOTODETECTOR

PRIORITY CLAIM

The present application is a Divisional of U.S. patent application Ser. No. 11/706,928, currently pending; which application claims the benefit of French Patent Application No. 06/50536, filed Feb. 14, 2006; all of the foregoing applications are incorporated herein by reference in their entireties.

TECHNICAL FIELD

Embodiments of the present invention generally relate to the field of imagers made in monolithic form. More specifically, embodiments of the present invention relate to the structure of photodetectors used in such imagers.

BACKGROUND

Fixed or mobile image acquisition devices are increasingly used in many fields. They must be inserted into smaller and smaller spaces. For example, image acquisition devices are inserted into portable phones. According to another example, in the medical field, it is desirable to have image acquisition devices of small dimensions able to be arranged on endoscopes.

It has thus been attempted to make, in monolithic form, image acquisition devices of small dimensions with an image quality at least comparable to that of known optical devices.

A monolithic image acquisition device includes photodetectors arranged at the intersection of lines and of columns of an array.

A cross-sectional view of FIG. 1 illustrates four photodetectors of a line or column of an image acquisition device. A photodetector comprises a photodiode D formed in a semiconductor substrate 1. The surface area taken up by photodiode D typically has a side or a diameter ranging between 0.2 and 1.5 µm. Substantially above the interval separating two neighboring photodiodes D, metal interconnects are formed in a dielectric 5. The metal interconnects are formed of several levels of metallization 3 and of vias. The thickness of dielectric 5 is generally greater than the total height of metallizations 3 and depends on technological constraints linked to standard technological processes and/or to the circuits formed around the image acquisition area, such as circuits for reading and processing the acquired images. The thickness of dielectric 5 typically ranges between 1.5 and 6.5 µm.

A succession of filters F of transparent resin colored in red R, green V, or blue B is formed in dielectric 5. Filters F follow one another so that, on a same line, two different colors alternate and that, on two successive lines, one color is common. For example, a first line comprises filters according to the sequence B-V-B-V and the next line comprises filters according to the illustrated sequence R-V-R-V. Filters F follow one another in a continuous fashion and the interface between two neighboring filters F is substantially above the middle of the interval separating two underlying photodiodes D. Thus, each photodetector comprises a filter F associated with a photodiode D. The filter F of each photodetector is topped with a respective converging lens L, also made of transparent resin.

It has been provided to form in each photodetector, between a filter F and its corresponding photodiode D, a waveguide G. Waveguide G is formed of a waveguide block 7 surrounded with dielectric 5. Block 7 is formed of a material with a refraction index $n_7$ greater than that, $n_5$, of dielectric 5 ($n_7 > n_5$). Block 7 is of straight or slightly conical cylindrical shape. Block 7 is placed above lens L to receive the photons injected by lens L towards photodiode D. The high portion of block 7 is separated from filter F by a thickness of dielectric 5 negligible as to the induced light losses, typically on the order of a few nanometers. Similarly, the bottom of block 7 is placed above photodiode D and is separated therefrom by a thickness of dielectric 5 on the order of a few nanometers. The presence of waveguide G enables decreasing light intensity losses and avoiding wrong detections linked to a dispersion of the photons and/or to their refraction against the metallizations 3 which appear across the relatively significant thickness of dielectric 5.

According to one example of the waveguide G, the guide is formed of a cone of a silicon, oxygen, carbon, and nitrogen compound called silicon oxynitride, which exhibits an index n on the order of from 1.6 to 2.3 according to its stoichiometry formed in a thick silicon oxide layer ($SiO_2$) of index n=1.43. Another example of the waveguide G uses tantalum oxide, which has an index n on the order of 2, as a high-index material.

However, the use of such materials may raise practical problems. In particular, block 7 of FIG. 1 of the present application is formed by filling a deep and narrow opening in the dielectric 5. "Deep and narrow" means in the present description an opening having a ratio between the depth (substantially equal to the thickness of dielectric 5) and the average diameter (substantially equal to that of photodiode D) greater than 2. The filling of such an opening, which is performed by chemical vapor deposition (CVD), must be homogeneous. However, on filling of a narrow and deep opening with compounds of silicon oxy-carbo-nitride type or with tantalum oxide, bubbles or cavities form. Such bubbles form traps for the received light. Further, when block 7 is formed of a silicon oxy-carbo-nitride or of tantalum oxide, problems of mechanical hold with peripheral silicon oxide 5 can be observed. Moreover, some of the silicon oxy-carbo-nitrides, as well as the tantalum oxide, deteriorate during the thermal cycles implemented in the rest of the process, especially the encapsulation and packaging anneals performed at temperatures from 300 to 400° C.

In another approach, a waveguide element is formed of alumina of index 1.63 or of silicon nitride (n=1.83) formed in a thick silicon oxide layer n=1.43. According to a variation of this approach, the high-index block 7 is silicon oxide n=1.43, formed in a thick dielectric layer 5 made of a material with a lower index such as an oxysilane of index 1.39.

The use of alumina or silicon nitride in a thick silicon oxide layer may exhibit disadvantages similar to those described previously for tantalum oxide or silicon oxy-carbo-nitrides.

The use of silicon oxide in oxysilane may also raise problems. In particular, this results in a significant modification of the materials used in the optical area with respect to the material present in the neighboring non-optical areas in which it is desirable to keep silicon oxide as an interlevel dielectric 5. This complicates and increases manufacturing costs. Further, the use in a thick layer of oxysilane with a refraction index lower than that of silicon oxide raises problems of mechanical hold, of ability to be locally etched, especially to form metallization levels 3 and the vias, as well as problems of resistance to thermal stress, especially on forming of the metal levels.

SUMMARY

One embodiment of the present invention is to provide a waveguide block which overcomes at least some of the disadvantages of known structures.

Another embodiment of the present invention is to provide such a block which is compatible with the use of silicon oxide as a thick peripheral dielectric.

Another embodiment of the present invention is to provide such a waveguide block which is compatible with the thermal cycles implemented after its forming and to provide such a block which is easy to manufacture in a narrow and deep opening.

According to one embodiment of the present invention, a photodetector includes a photodiode formed in a semiconductor substrate and a waveguide element formed of a block of a high-index material extending vertically above the photodiode in a thick layer of a dielectric superposed to the substrate, the thick layer being formed at least as a majority, of silicon oxide and the block being formed of a polymer of the general formula $R_1R_2R_3SiOSiR_1R_2R_3$ where $R_1$, $R_2$, and $R_3$ are any carbonaceous or metal substituents and where one of $R_1$, $R_2$, or $R_3$ is a carbonaceous substituent having at least four carbon atoms and/or at least one oxygen atom.

The block may exhibit a ratio between its depth and its average diameter greater than 2. A colored filter may be placed above the block and a converging lens may also be placed above the block. The lens may be laterally offset with respect to the block. The polymer according to an embodiment of the present application may be an SOG-type glass comprising tantalum, titanium, and/or zirconium inclusions. An image acquisition device may include a plurality of such photodetectors.

BRIEF DESCRIPTION OF THE DRAWINGS

The foregoing features of the present invention will be discussed in detail in the following non-limiting description of specific embodiments in connection with FIG. 1, previously described, which is a partial cross-sectional view of a known image acquisition device.

DETAILED DESCRIPTION

Figure 1:
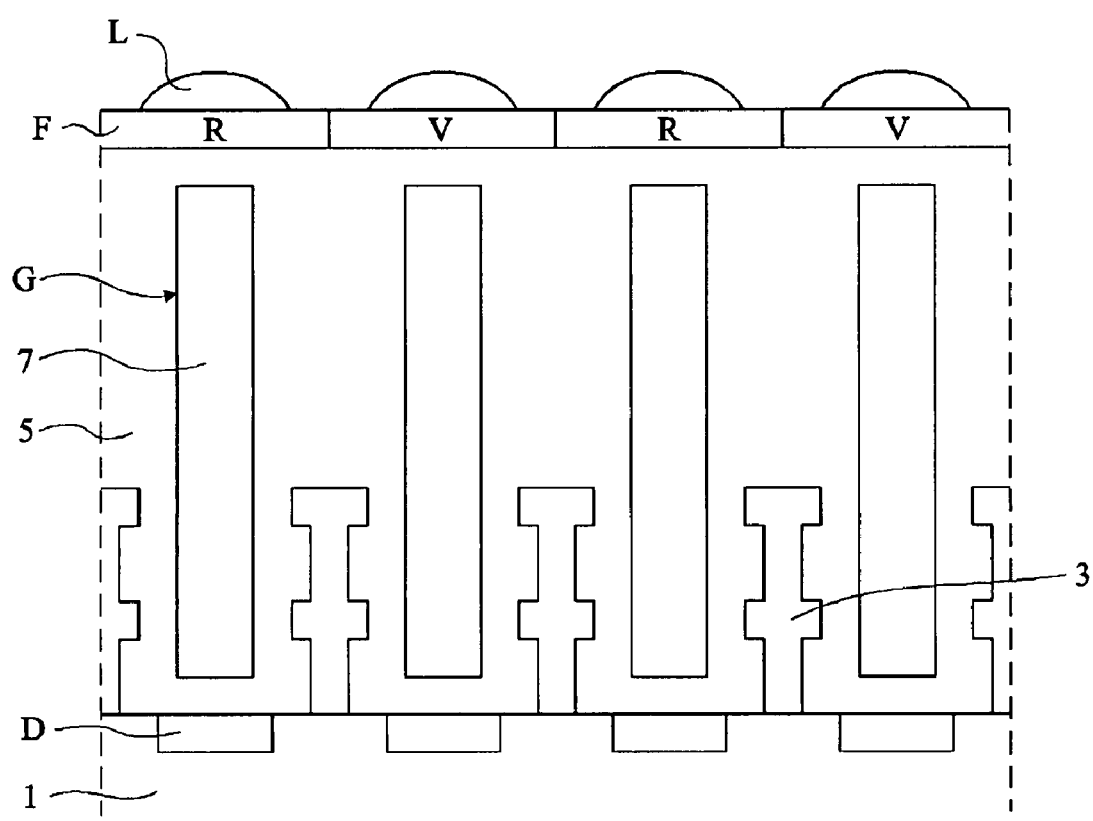

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein. As usual in the representation of semiconductor components, FIG. 1 is not drawn to scale.

Referring to FIG. 1, an embodiment of the present invention uses a block 7 formed of a polymer of the general formula $R_1R_2R_3SiOSiR_1R_2R_3$ where $R_1$, $R_2$, and $R_3$ are any carbonaceous or metal substituents such as tantalum, titanium, or zirconium compounds and where one of $R_1$, $R_2$, or $R_3$ is a carbonaceous substituent having at least four carbon atoms and/or at least one oxygen atom and the polymer having a refraction index greater than the refraction index of silicon oxide which is equal to 1.43, this block being buried in the silicon oxide.

Such polymers exhibit many advantages when used for forming the waveguide blocks 7. First, as indicated previously, the refraction index of such polymer is greater than that of the silicon oxide dielectric 5 in which the block is formed. Interlevel dielectric 5 then is the same in the optical areas including the photodiodes D as in the neighboring non-optical areas. This simplifies the fabrication process.

Further, as they are spun on and not deposited by chemical vapor deposition (CVD) like conventionally-provided materials, the above-described polymers can be deposited in the deep and narrow openings having a ratio between depth and average diameter of greater than 2.

Moreover, during the deposition, such polymers polymerize in a chain, which reliably and reproducibly results in the forming of a homogeneous block 7, that is, with no cavities or bubbles.

Furthermore, the compatibility between such a polymer and a peripheral silicon oxide (dielectric 5) is good. There is no phenomenon of mechanical separation between these polymers and silicon oxide, nor is there any cross contamination. There are no longer wetting defects likely to result in the forming of cavities.

Additionally, the above-defined polymers present a high range barrier power against the diffusion of the metal elements constituting the colored resins of the filters F of FIG. 1. This barrier is higher than the barrier of the known materials as silicon oxynitride, tantalum oxide, alumina, silicon oxide silicon nitride, methylsiloxane, silicates or phosphosilicates. Such a barrier property is highly advantageous. It avoids deteriorating the filters during the fabrication process due to the diffusion of the metal elements of the colored resins in the wave guide. It increases the performances and the lifetime of an imager using such a waveguide. Especially, it deeply reduces the loss of performances due to the above-described diffusion during the life of the imager.

Moreover, such polymers exhibit a good resistance to temperatures greater than 400° C. Thus, these polymers are thermally compatible with semiconductor circuit manufacturing processes.

The block 7 may be formed, for example, of a quasi-inorganic siloxane-based insulator of SOG (spun on glass) type, including or not metallic tantalum, titanium, and/or zirconium inclusions and having a refraction index ranging between 1.56 and 1.6, such as manufactured by Tokyo Ohka Kogyo. Another possible polymer is a siloxane material, having a refraction index ranging between 1.64 and 1.7 such as that manufactured by Silecs Inc.

The present invention is likely to have various alterations, modifications, and improvements which will readily occur to those skilled in the art. In particular, only those elements of the monolithic structure of a photodetector which are necessary to the understanding of the present invention have been described. It will be within the abilities of those skilled in the art to complete the structure to form an operative device. Further, it should be understood by those skilled in the art that the present invention applies to photodetectors of different structures. For example, a photodetector may comprise no filter F or lens L.

Further, it should be understood by those skilled in the art that dielectric 5 has been considered as homogeneous as a non-limiting example only and for clarity. In practice, dielectric 5 may be made of silicon oxide only across the greatest part of its thickness, that is, it may have a multiple-layer structure. In particular, dielectric 5 is typically formed of an alternation of thick silicon oxide sub-layers separated by thin sub-layers of an etch stop insulator such as silicon nitride. The presence of such thin sub-layers does not affect the operation of the photodetectors.

Moreover, embodiments of the present invention have been described in the case of a block 7 exhibiting a ratio between its depth and its average diameter greater than 2. However, it should be understood by those skilled in the art that such blocks may exhibit a ratio between their depth and their average diameter which is less than 2.

Further, it should be understood by those skilled in the art that waveguides according to embodiments of the present invention have been described as applied to a device as illustrated in FIG. 1 as a non-limiting example only. Embodiments of the present invention also apply to image acquisition devices exhibiting a different general structure. Thus, for example, colored filter F and lens L may altogether be radially offset with respect to underlying block 7 to correct an angle of view which varies from the center of the sensor to the edge of the sensor. In this case, it should be noted that it will be preferable to form between each block 7 and filter F a significant thickness of the dielectric, for example, on the order of from 200 to 1,500 nm.

Generally, it will be within the abilities of those skilled in the art to select an appropriate polymer from among the polymers available for sale with a refraction index greater than that of the dielectric 5 that is used.

Image acquisition devices including arrays of photodetectors according to embodiments of the present invention may be any type of electronic device containing an image acquisition device, such as cellular phones, digital cameras, video cameras, personal digital assistants (PDAs), and so on.

Alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A photodetector array comprising a plurality of photodetectors formed on a substrate, the photodetectors being arranged in rows and columns and each photodetector comprising:
    a photodiode formed in the substrate;
    a waveguide including,
    a dielectric layer formed on the photodiode; and
    a polymer element formed in the dielectric layer adjacent and not contiguous with the photodiode, the polymer having the general formula $R_1R_2R_3SiOSiR_1R_2R_3$ where $R_1$, $R_2$, and $R_3$ are any carbonaceous or metal substituents and where one of $R_1$, $R_2$, or $R_3$ is a carbonaceous substituent having at least four carbon atoms and/or at least one oxygen atom.

2. The photodetector array of claim 1 wherein the polymer element of each photodetector has a depth and an average diameter, and wherein the ratio of the depth to the average diameter is greater than 2.

3. The photodetector array of claim 1 wherein each photodetector further comprises a color filter formed on the silicon oxide dielectric layer adjacent the photodiode.

4. The photodetector array of claim 1 wherein the dielectric layer comprises a plurality of layers.

5. The photodetector array of claim 4 wherein the dielectric layer has an overall thickness and wherein the plurality of layers includes at least one silicon oxide layer, a thickness of all the silicon oxide layers being at least one half the overall thickness of dielectric layer.

6. A photodetector array comprising a plurality of photodetectors formed on a substrate, the photodetectors being arranged in rows and columns and each photodetector comprising:
    a photodiode formed in the substrate;
    a waveguide including,
    a dielectric layer formed on the photodiode; and
    a polymer element formed in the dielectric layer adjacent the photodiode, the polymer having the general formula $R_1R_2R_3SiOSiR_1R_2R_3$ where $R_1$, $R_2$, and $R_3$ are any carbonaceous or metal substituents and where one of $R_1$, $R_2$, or $R_3$ is a carbonaceous substituent having at least four carbon atoms and/or at least one oxygen atom;
    wherein the polymer element comprises a siloxane polymer element having a general formula of R1R2R3SiOSiR1R2R3, wherein R1, R2, and R3 are any carbonaceous or metal substituents such as tantalum, titanium, or zirconium compounds.

7. The photodetector array of claim 6 wherein the dielectric layer comprises silicon oxide having a refraction index of 1.43 and wherein R1, R2, and R3 have a refraction index that is greater than 1.43.

8. The photodetector array of claim 1 wherein the substrate comprises a semiconductor substrate.

9. The photodetector array of claim 1 further comprising a plurality of metal interconnects, each metal interconnect being formed between adjacent photodiodes.

10. A photodetector array comprising a plurality of photodetectors formed on a substrate, the photodetectors being arranged in rows and columns and each photodetector comprising:
    a photodiode formed in the substrate;
    a waveguide including,
    a dielectric layer formed on the photodiode; and
    a polymer element formed in the dielectric layer adjacent the photodiode, the polymer having the general formula $R_1R_2R_3SiOSiR_1R_2R_3$ where $R_1$, $R_2$, and $R_3$ are any carbonaceous or metal substituents and where one of $R_1$, $R_2$, or $R_3$ is a carbonaceous substituent having at least four carbon atoms and at least one oxygen atom.

11. A photodetector array comprising a plurality of photodetectors formed on a substrate, the photodetectors being arranged in rows and columns and each photodetector comprising:
    a photodiode formed in the substrate;
    a waveguide including,
    a dielectric layer formed on the photodiode; and
    a polymer element formed in the dielectric layer adjacent the photodiode, the polymer having the general formula $R_1R_2R_3SiOSiR_1R_2R_3$ where $R_1$, $R_2$, and $R_3$ are any carbonaceous or metal substituents and where one of $R_1$, $R_2$, or $R_3$ is a carbonaceous substituent having at least four carbon atoms.

12. A photodetector array comprising a plurality of photodetectors formed on a substrate, the photodetectors being arranged in rows and columns and each photodetector comprising:
    a photodiode formed in the substrate;
    a waveguide including,
    a dielectric layer formed on the photodiode; and
    a polymer element formed in the dielectric layer adjacent the photodiode, the polymer having the general formula $R_1R_2R_3SiOSiR_1R_2R_3$ where $R_1$, $R_2$, and $R_3$ are any carbonaceous or metal substituents;
    wherein the polymer element comprises a siloxane polymer element having a general formula of R1R2R3SiOSiR1R2R3, wherein R1, R2, and R3 are any carbonaceous or metal substituents such as tantalum, titanium, or zirconium compounds.

13. An integrated circuit, comprising:
    a photodetector array comprising a plurality of photodetectors formed on a substrate, the photodetectors being arranged in rows and columns and each photodetector comprising:
    a photodiode formed in the substrate;
    a waveguide including,
    a dielectric layer formed on the photodiode; and a polymer element formed in the dielectric layer adjacent the photodiode, the polymer having the general formula $R_1R_2R_3SiOSiR_1R_2R_3$ where $R_1$, $R_2$, and $R_3$ are any carbonaceous or metal substituents and where one of $R_1$, $R_2$, or $R_3$ is a carbonaceous substituent having at least four carbon atoms.

14. The integrated circuit of claim 13, further comprising a single integrated circuit die.

15. The integrated circuit of claim 13, further comprising multiple integrated circuit dies.

* * * * *